United States Patent [19]

Douglas

[11] Patent Number: 4,675,073

[45] Date of Patent: Jun. 23, 1987

[54] TIN ETCH PROCESS

[75] Inventor: Monte A. Douglas, Coppell, Tex.

[73] Assignee: Texas Instruments Incorporated, Dallas, Tex.

[21] Appl. No.: 837,462

[22] Filed: Mar. 7, 1986

[51] Int. Cl.$^4$ ............... B44C 1/22; C03C 15/00; C03C 25/06
[52] U.S. Cl. ................... 156/643; 29/571; 156/644; 156/646; 156/653; 357/41; 357/59
[58] Field of Search ............... 156/643, 644, 646, 653, 156/655, 656, 657, 659.1, 662; 204/192 EC, 192 E; 29/571, 576 W, 580, 591; 427/88–89; 357/23.6, 23.11, 41, 47, 59, 65, 71; 252/79.1

[56] References Cited

U.S. PATENT DOCUMENTS 4,481,706  11/1984  Roche ..................... 156/643 X

Primary Examiner—William A. Powell
Attorney, Agent, or Firm—Robert Groover, III; James T. Comfort; Mel Sharp

[57] ABSTRACT

A plasma etch process for etching titanium nitride selectively with respect to titanium silicides. A reducing electrode, a low flow rate, and a non-copious fluorine source (such as CF$_4$) are used to achieve a fluorine-deficient plasma. Preferably the substrate temperature is allowed to rise above 50 C during etching.

17 Claims, 18 Drawing Figures

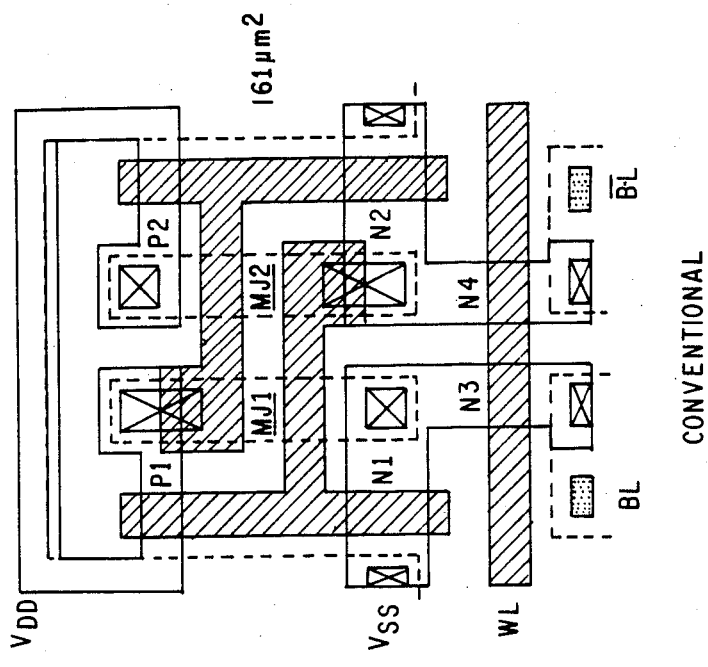
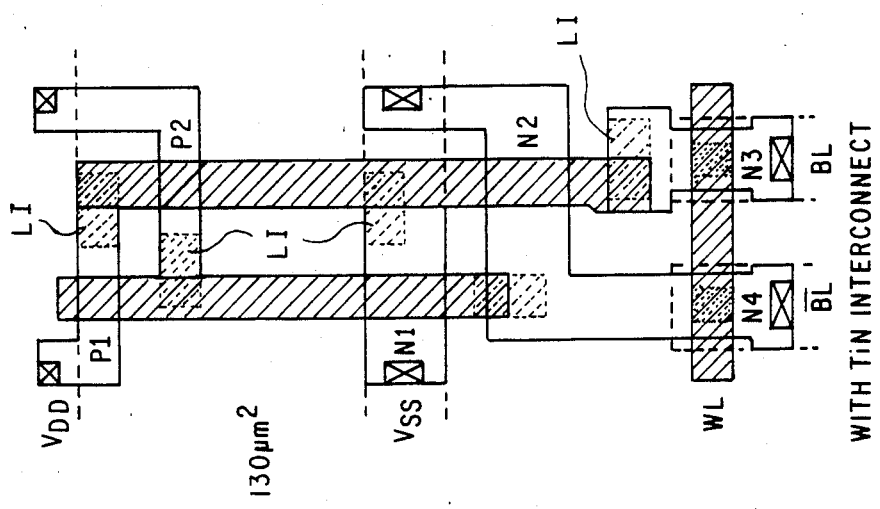

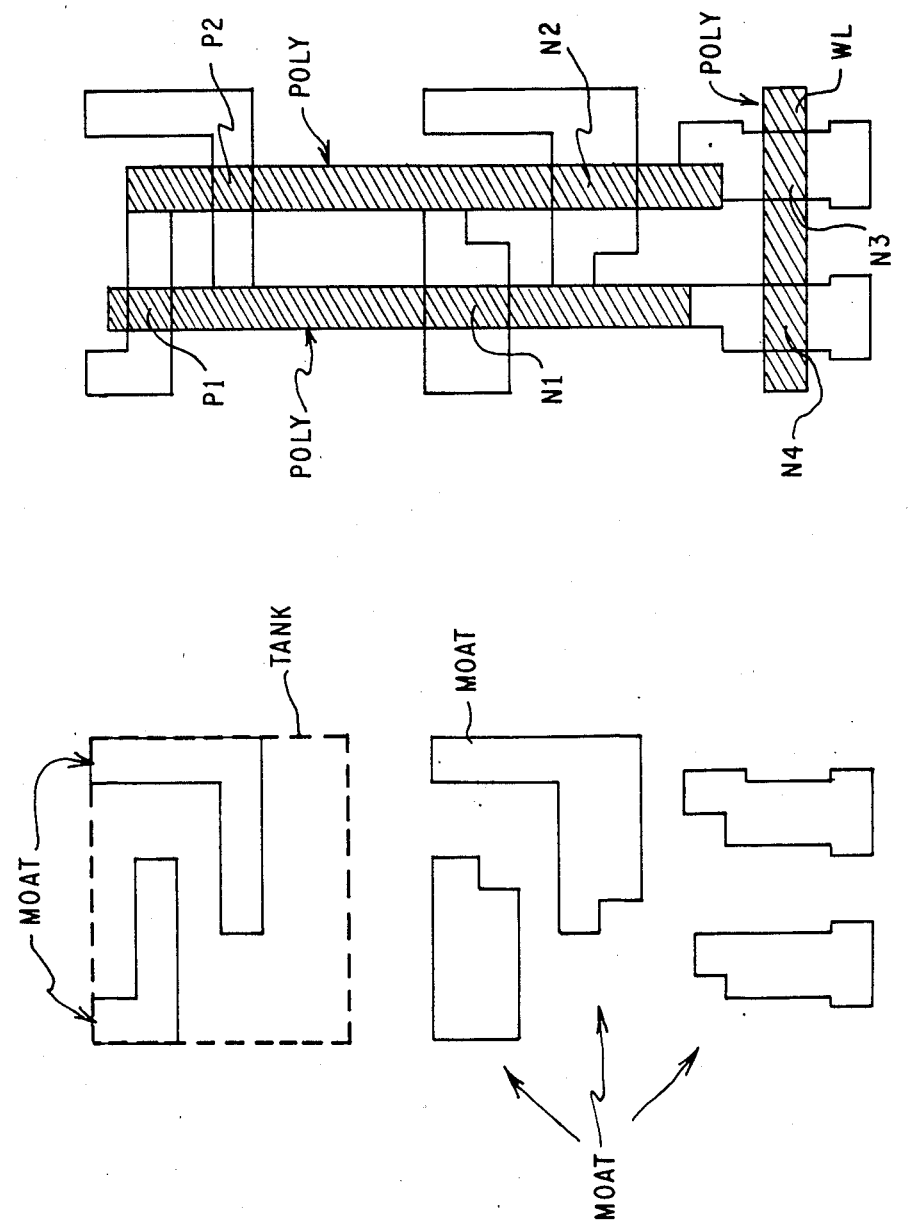

TIN ETCH PROCESS

BACKGROUND AND SUMMARY OF THE INVENTION

The present invention relates to very large scale integrated circuits, and to methods for fabrication thereof.

Interconnect technology is increasingly a major limitation in the fabrication of very large scale integrated circuits. In particular, the use of multiple patterned polysilicon or metal layers for interconnects places great pressure on the processing technology related to etching of contact holes and planarization of interlevel dielectrics. However, the additional routing capability which is provided by any additional level of interconnect will often give circuit designers options which translate into more compact layouts, better circuit performance, and/or greater ease of circuit design.

For these reasons much effort has been dedicated to modifying processes to include a buried contact. A buried contact process is a process which uses a single layer to form not only MOS gates, but also, using other patterned portions of the same layer, contact to the source/drain regions of MOS transistors. That is, the same thin film polysilicon or polycide layer must in some locations be separated from the moat by a very thin high-integrity gate oxide, and in other locations must form an ohmic contact to highly doped moat regions. This leads to three main classes of processing problems: first, gate oxide integrity becomes more difficult to preserve. Second, scalability is limited by interdiffusion between the polysilicon material and the bulk silicon. That is, phosphorus doping used to make the polysilicon conductive will normally outdiffuse into the silicon substrate at the contact location. However, as devices are scaled to small geometries, this phosphorus diffusion can counterdope a major fraction of the channel stop doping, leading to leakage between active areas. Third, first contacts are highly desirable in CMOS processing, but present technology does not provide any manufacturable process to make contact to P+ moat regions. Not only is there the problem of how to avoid a diode between N+ poly and P+ substrate, but similar problems of dopant outdiffusion may lead to shorting from the poly to the PMOS substrate at first contacts to P+.

There have been published suggestions of ways to provide a local interconnect level in the context of a self-aligned titanium silicide process for source/drain silicidation. The self-aligned titanium silicide source/drain silicidation process is disclosed in U.S. patent application Ser. No. 492,069, filed May 6, 1983, U.S. Pat. No. 4,454,116, which is hereby incorporated by reference. In this process, metallic titanium is deposited overall, and is then heated in a nitrogen atmosphere so that the titanium reacts with exposed silicon surfaces (such as source/drain regions, or exposed upper surfaces of polysilicon lines) to form titanium silicide. The portions of titanium which did not react to form silicides are then stripped (using, for example, a wet etch). This process provides a self-aligned silicidation process without any patterning steps. This self-aligned silicidation process has come into wide use in integrated circuit fabrication.

The previously proposed local interconnect schemes based on this process use additional patterned silicon to provide conductive silicide regions extending out over the field oxide as desired. That is, in the process developed by Hewlett Packard and published at Page 118 of the 1984 IEDM Proceedings, (which publication is hereby incorporated by reference), after the titanium metal is deposited overall, and before heat is applied to effect silicide reaction, a thin layer of silicon (either polycrystalline or amorphous) is patterned on top of the titanium metal. Where this silicon layer has been applied, a silicide will form during the reaction process, so that silicides can be formed extending over the gate sidewall oxide or over the field oxide. A similar approach previously developed at Texas Instruments used patterned silicon straps which were applied before the titanium metal was applied.

However, both of these approaches have the limitation that deposition of an additional layer is required. Thus, both of these approaches contain excess processing complexities.

Other publications relevant to examination of the present application may be found in the paper by C. Y. Ting at page 110 of the 1984 IEDM proceedings (and see especially page 113) and in the paper by M. Alperin et al., Development of the Self-aligned $TiSi_2$ Process for VLSI applications, at page 141 of the February 1985 issue of the IEEE transactions on Electron Devices.

The present invention provides a simpler method of forming local interconnects in the context of a self-aligned direct-react titanium silicide process for source/drain (and preferably gate) silicidation.

It has been discovered that when the direct-react titanium silicide silicidation process is performed in a nitrogen atmosphere, a layer of titanium nitride (TiN) is formed in the titanium metal layer over field oxide. Thus, after the silicide reaction occurs, the portions of the deposited titanium metal layer which have not been in contact with a source of silicon (and therefore have not formed silicide) are not merely unreacted titanium metal, as was previously thought, but include a large fraction of titanium nitride. The present invention makes use of this newly discovered titanium nitride layer to provide a new and advantageous local interconnect method and structure.

After the silicidation step, the titanium nitride layer is patterned and selectively removed from titanium silicide and silicon oxide regions where it is not desired. After this, a final anneal is performed at higher temperature (e.g. 800° C.) to reduce the final sheet resistance of the titanium silicide layers to below one ohm per square.

It is well-known in the integrated circuit art that titanium nitride is conductive, and the use of titanium nitride as a conductive diffusion barrier in contacts has been previously published; but not work published prior to the filing date of the parent application is known to discuss the use of titanium nitride to provide local interconnects, as in the present invention.

In a 1985 IEDM paper, researchers from Hewlett-Packard proposed applying a sputtered silicon layer over the deposited titanium metal, in a direct-react titanium silicidation process, before the reaction step, to provide patterned local interconnects of titanium silicide. These local interconnects were apparently thought at the time to provide advantages comparable to that of the titanium nitride interconnect of the present invention. However, not only does this approach require greater processing complexity, but it also fails to provide a crucial advantages of the present invention: the titanium silicide provides an efficient diffusion path for boron and phosphorous, and therefore problems of interdiffusion and counterdoping remain acute. By contrast, in the present invention the titanium nitride is a very good diffusion barrier, and these problems do not arise. The phosphorus counterdoping problems of the process shown in the HP 1985 paper may be confirmed by a more recent HP paper which describes a 16K static random access memory implemented with their TiSi$_2$ strap process, but that only uses it to connect P-type and N-type junctions together. That is, the HP researchers did not use local interconnect to connect gates to junctions. In a design experiment to test the advantages of the present invention, researchers at Texas Instruments laid out a static random access memory cell according to the exact HP layout, i.e. where local interconnect is used to interconnect junctions, and where metal straps plus 2nd contacts are used to cross-couple the gates. In this HP process, the inability to interconnect both the gates and junctions with local interconnect results in a cell size, using 1 micron design rules, that is 75% larger than a cell with the same design rule geometries using TiN for local interconnect. This illustrates the advantage that TiN has over TiSi$_2$ for performing the local interconnect function.

The ability to plasma etch TiN selectively with respect to TiSi$_2$ permits easy fabrication of a structure wherein moat-to-moat interconnections have been formed using a very thin (e.g. 1000 Angstroms) layer of titanium nitride. This invention thus provides at least the following advantages:

1. Processing is simpler than in the methods for forming titanium silicide local interconnects discussed above.
2. Since titanium nitride is a very good diffusion barrier, problems of interdiffusion through the silicide are avoided. This is particularly advantageous where the local interconnect layer is used to connect a p+ moat region to an n+ polysilicon gate or to an n+ moat region in CMOS processing.
3. Titanium nitride local interconnects according to the present invention are most especially advantageous in providing local interconnect between an n+ polysilicon gate and a p-type moat region. Since the distances from gate to moat are typically much shorter than the n+ to p+ spacings, interdiffusion is a particularly acute problem here.
4. Since the titanium nitride local interconnect layer can be made extremely thin, the amount of additional vertical topography induced in subsequent unplanarized layers is minimal.
5. Since the titanium nitride layer is so thin, the etch used to remove it need not be anisotropic, which again simples processing.
6. Even a very thin titanium nitride layer can provide very low sheet resistances, of the order of five to ten ohms per square.
7. The titanium nitride local interconnect layer can also be utilized to provide a diffusion barrier in place for contacts. That is, contacts to moat can deposit metal on top of the titanium nitride layer rather than directly on silicon, so that interdiffusion between metal and silicon is effectively prevented. This simplifies the selection of interconnect metalization. In particular, use of non-aluminum metallization now becomes much more practical.
8. The overlap of the titanium nitride onto the field oxide means that the contact holes need not be perfectly aligned to the edge of the moat, but the contact hole can overlap onto the titanium nitride over the upper surface of the edge of the field oxide.
9. The present invention provides a local interconnect layer of such good conductivity that strapping can be avoided in some applications, and thus the present invention will permit the elimination of double-level metal (DLM) process steps in some processes, without any sacrifice of speed or area.
10. The number of second contacts in a layout can be reduced, since independent interconnection through a TiN layer can substitute for some metal interconnects.
11. The present process is inherently amenable to shared contacts, i.e. to contacts where contact is made between two interconnect layers and substrate at the same location. This permits designers additional flexibility.
12. The methods using silicon straps for local interconnect are inherently susceptible to open circuit defects where the silicon strap crosses the angle at the foot of the gate, and, to avoid this, the silicon straps need to be made relatively thick (as much as 2500 A thick in some processes), which degrades topography and throughput. By contrast, the TiN straps of the present invention do not have this problem, and therefore do not need to be made so thick.
13. Titanium nitride is more resistant to oxide etches than titanium silicide is, so that damage caused by overetching the multilevel oxide at the contact etch step in a process using a planarized multilevel oxide are reduced.
14. The capability of overlapping moat contacts up onto the field oxide means that minimum geometry can be used for the source/drain regions in the moat.
15. The present invention permits connection between stages of CMOS logic to be accomplished without any contact holes, which provides advantages in area, speed, and yield.
16. The present invention performs all the functions of a full buried contact capability, without the degradation in gate oxide integrity which commonly results from buried contact processes.
17. The present invention performs all the functions of a full buried contact capability, without the degraded reproducibility of series resistance for ohmic contacts to p+ which commonly results from buried contact processes.
18. The present invention performs all the circuit functions of a full buried contact capability, without the problem of shorting to an underlying n+ region where a local connection from polysilicon to a p+ source/drain region.

According to the present invention there is provided:
A process for fabricating integrated circuits, comprising the steps of:
1. providing a substrate;
2. providing device isolation areas in a predetermined pattern to define moat regions in predetermined locations;
3. fabricating insulated gate field effect transistors in predetermined locations in said moat regions;
4. depositing a metal consisting substantially of titanium overall;
5. heating said substrate and said titanium metal in a nitrogen-bearing atmosphere, so that said titanium metal reacts with exposed silicon portions of said substrate to form titanium silicides, and other portions of said titanium metal also react with said nitrogen atmosphere to form a layer having a large fraction of titanium nitride at the surface thereof; and 6. patterning said titanium nitride layer to provide local interconnection in a predetermined pattern.

According to the present invention there is also provided: An integrated circuit device comprising:
a substrate;
device isolation regions defining predetermined moat areas of exposed semiconducting material;
a plurality of active devices near the surface of said moat areas; and
a local interconnect layer, comprising lines consisting substantially of titanium nitride, interconnecting predetermined portions of said moat regions over said device isolation regions.

According to the present invention there is also provided: An integrated circuit device comprising:
a substrate;
a plurality of NMOS transistors having
  substantially crystalline channel regions consisting essentially of silicon and located near the surface of said substrate, and
  gates which are substantially polycrystalline and comprise a large fraction of silicon and are doped n-type;
a plurality of PMOS transistors having
  substantially crystalline channel regions consisting essentially of silicon and located near the surface of said substrate, and
  gates which are substantially polycrystalline and comprise a large fraction of silicon and are doped p-type; and
a plurality of local interconnects electrically linking selected ones of said gates of said NMOS transistors to selected ones of said gates of said PMOS transistors in predetermined locations, said local interconnects comprising a large fraction of titanium nitride.

According to the present invention there is also provided: A static random access memory cell array, comprising
a plurality of static random access memory cells, each comprising
  first and second cross-coupled inverters,
  each said inverter comprising
    a pull-up transistor
    and a pull-down transistor,
  all of said respective pull-down transistors within each individual one of said cells being separated one from another by a field oxide region.

A static random access memory cell comprising:
first and second cross-coupled inverters, each said inverter comprising
  a pull-up transistor
  and a pull-down transistor,
  each said pull-up transistor and pull-down transistor
    having a crystalline channel with a source connected to a substantially constant voltage
    and having an insulated gate capacitatively coupled to said channel
    and having a drain,
said gate of at least one of said pull-up and pull-down transistors of said first inverter being connected to a drain of at least one of said pull-up and pull-down transistors of said second inverter through a local interconnect layer,
  said local interconnect layer having a minimum thickness less than that of said gate of said pull-up transistor of said first inverter
  and making ohmic contact directly to said gate and to said drain.

A static random access memory cell comprising:
first and second cross-coupled inverters, each said inverter comprising
  a pull-up transistor
  and a pull-down transistor; and
first and second access transistors selectably connecting outputs of said first inverter to a first bit line and outputs of said transistors of said second inverter to a second bit line;
wherein both of said respective pull-down transistors within each single one of said cells are formed in a common substrate and are separated one from another by field isolation regions.
and wherein both of said respective pull-up transistors within each single one of said cells are formed in a common substrate and are separated one from another by field isolation regions,
and wherein both of said respective access transistors connected to each single one of said cells
  are formed in a common substrate
  and are separated
    one from another
    and from both of said pull-up transistors within said single cell
    and from both of said pull-down transistors within said single cell
  by field isolation regions.

According to the present invention there is also provided: A process for fabricating integrated circuits including local interconnect, comprising the steps of:
1. providing a partially fabricated integrated circuit structure including moat regions, said moat regions incorporating active devices therein;
2. depositing a thin layer of metal consisting predominantly of titanium overall;
3. depositing a relatively inert material over said titanium in locations defining local interconnect pathways and/or locations of contacts to moat;
4. reacting said partially fabricated structure in an atmosphere containing a high portion of nitrogen, whereby portions of said titanium metal over moat regions are predominantly converted to titanium silicide, and portions of said titanium metal over oxide regions are converted predominantly to titanium nitride;
5. etching away exposed portions of said titanium and of said titanium nitride, to define local interconnects in predetermined local interconnect locations.

According to the present invention there is also provided: A process for fabricating integrated circuits, comprising the steps of:
1. providing a partially fabricated integrated circuit structure;
2. providing a thin film which consists substantially of titanium nitride and which extends over a significant area of said partially fabricated integrated circuit structure;
3. providing a patterned masking material over said titanium nitride thin film; and
4. etching said titanium nitride thin film in a glow discharge formed from an input gas flow comprising a fluorine-liberating gas.

According to the present invention there is also provided: A process for fabricating integrated circuits, comprising the steps of:

1. providing a substrate;
2. providing device isolation areas in a predetermined pattern to define moat regions in predetermined locations;
3. forming a first patterned thin film conductor layer in predetermined locations;
4. fabricating insulated gate field effect transistors in predetermined locations in said moat regions, said transistors comprising gates formed in a second patterned thin film conductor layer which comprises a large fraction of silicon;
5. depositing a metal consisting substantially of titanium overall;
6. heating said substrate and said titanium metal in a nitrogen-bearing atmosphere, so that said titanium metal reacts with exposed silicon portions of said substrate to form titanium silicides, and other portions of said titanium metal also react with said nitrogen atmosphere to form a layer having a large fraction of titanium nitride at the surface thereof; and
7. patterning said titanium nitride layer to provide local interconnection among said substrate, said gates of said transistors, and said first conductor level in a predetermined pattern.

According to the present invention there is also provided: An integrated circuit device comprising:
a substrate;
device isolation regions defining predetermined moat areas of exposed semiconducting material;
first and second thin film conductor layers;
a plurality of active devices near the surface of said moat areas; and
a local interconnect layer, comprising lines consisting substantially of titanium nitride, interconnecting predetermined portions of said moat regions with predetermined portions of said first and second thin film conductor layers.

BRIEF DESCRIPTION OF THE DRAWINGS

The present invention will be described with reference to the accompanying drawings, wherein:

FIG. 5a shows a conventional double metal six transistor CMOS SRAM cell, and FIG. 5b shows a CMOS 6T SRAM cell laid out using the same geometrics as the cell of FIG. 5a, but with the use of titanium nitride local interconnects, to provide a 25% packing density increase;

FIGS. 6a through 6e are corresponding overlays showing a second 6T CMOS SRAM layout using titanium nitride interconnect, in which the interconnect capabilities of the titanium nitride have been taken advantage of to reduce parasitic capacitance and therefore increase speed;

DESCRIPTION OF THE PREFERRED EMBODIMENTS

The making and use of the presently preferred embodiments will now be discussed in great detail. However, it should be appreciated that the present invention provides widely applicable inventive concepts, which can be embodied in a tremendous variety of specific contexts; the specific embodiments discussed are merely illustrative of specific ways to make and use the invention, and do not delimit the scope of the invention.

Figure 1:
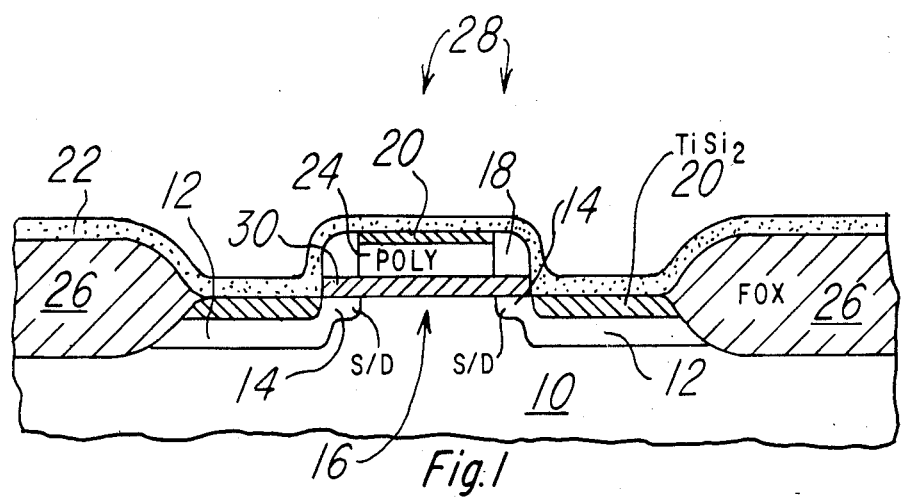
FIG. 1 shows a portion of a moat region after titanium has been deposited and reacted to form titanium silicide regions where silicon was exposed, and titanium nitride elsewhere.

FIG. 1 shows a sample embodiment of the invention. A silicon substrate 10 has had device isolation regions (in this case field oxide region 26) patterned to define moat regions 28 where active devices are to be formed. In the embodiment shown in FIG. 1, the field oxide 26 has the characteristic shape of a LOCOS field oxide, but the present invention can of course be practiced using other isolation technologies, such as sidewall mask isolation or direct moat isolation.

A transistor is shown in moat region 28. This transistor includes source/drain regions 12, including lightly doped source/drain extensions 14 (commonly referred to as LDD regions). A polysilicon gate 24 is capacitively coupled, through gate oxide 30, to channel region 16. The source/drain regions 12 have titanium silicide layers 20 at their surfaces, and another portion of titanium silicide layer 20 also lies on the top surface of polysilicon gate 24. Sidewall oxide filaments 18 separate the polysilicon gate 24 from the silicide regions 20 on the source/drain regions 12.

In the stage of processing shown in FIG. 1, a titanium nitride layer 22 overlies the integrated circuit essentially everywhere. This titanium nitride layer 22 is formed by depositing titanium metal everywhere, and then heating the integrated circuit structure in a nitrogen atmosphere. The titanium nitride layer 22 will typically be thin everywhere, but will be thinner over the silicide regions 20 than over the field oxide 26.

For example, in the presently preferred embodiment the titanium metal is deposited by sputtering at room temperature to a thickness of 900 Angstroms everywhere. The substrate is then heated to 675 C. for 30 minutes in an atmosphere of nitrogen and argon at a pressure of 1 atmosphere. This will cause titanium silicide regions 20 to form where the titanium metal is in contact with the silicon. This also causes formation of the titanium nitride layer 22.

The chemistry of the titanium nitridation reaction is not well understood. It is believed that, although the nitridation and silicidation of the silicon are competing reactions, the nitridation is inherently self-limiting (due to the diffusion barrier qualities of TiN), and the silicidation does not effect a very substantial reconversion of nitrides to silicides.

In addition, it has been found that the nitridation of titanium lines running over oxide is somewhat sensitive to the particular oxide doping used. The resistance to etching of the nitride layer is different over field oxide regions which have been exposed to different source/drain implant species. Thus, for some processes, use of the local interconnect process of the present invention may also have implications for the selection of the interlevel oxide used.

As this sensitivity indicates, the "titanium nitride" layer of the present invention is almost certainly not pure titanium nitride, but contains other titanium compounds as well. The term "titanium nitride layer" is used in the present application to refer to thin film layers which are not necessarily pure titanium nitride, but which may be: (1) more than 30% atomic nitrogen and more than 20% atomic titanium for more than 10% of their thickness, or (2) include a surface layer having a high concentration of titanium nitride and have a bulk concentration of more than 5% atomic nitrogen.

Similarly, it should be noted that the titanium metal used (in the most preferred embodiments) to produce $TiSi_2$ and TiN need not be strictly pure titanium. It may be desired to introduce alloying elements into the as-deposited metal, to provide better physical properties in the resulting silicides and nitrides; and these embodiments, where the reaction chemistry and the properties of the resulting structures are approximately the same as that occurring with Ti, are also within the scope of the present invention.

In the most preferred embodiments of the present invention, the titanium metal is deposited to more than 600 A and less than 2000 A thickness, and the silicide reaction step is performed at a temperature in the range between 500 C. and about 750 C. for a time in range of 15 to 90 minutes (and, even more preferably, less than 40 minutes).

It should also be noted that, depending on the silicidation reaction conditions, the titanium nitride layer 22 may not be entirely stoichiometric at this stage. That is, the layer 22 may contain more or less than 50 atomic percent of titanium. In some embodiments this may actually be desirable, as will be discussed below. The titanium nitride referred to in the present application does not have to be strictly TiN, but may be described more precisely as $Ti_xN_y$.

In an alternative class of embodiments, the thickness of the TiN layer may be increased by an additional deposit and react step. (Note that the alloy compositions in the first and second metal deposit steps do not have to be identical.)

A sample embodiment of the process for increasing TiN thickness is as follows. FIGS. 9A through 9E illustrate these steps.

Figure 9A:
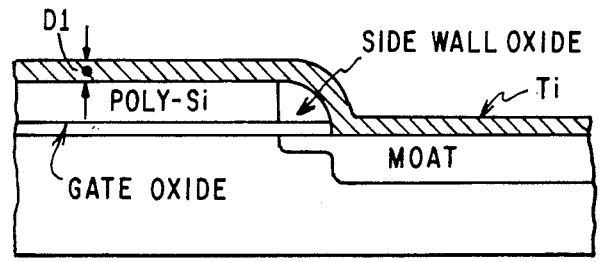
FIGS. 9A through 9E show sequential steps in an alternative embodiment wherein two nitrogen-ambient reaction steps are used to increase nitride thickness without increasing silicide thickness.
Figure 9B:
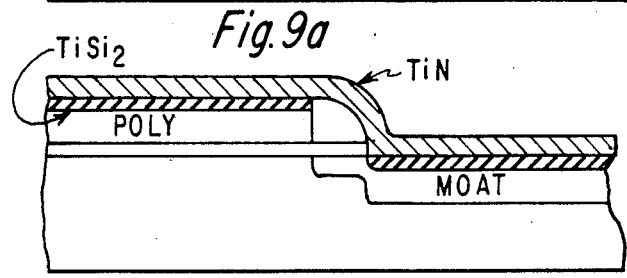
Figure 9C:
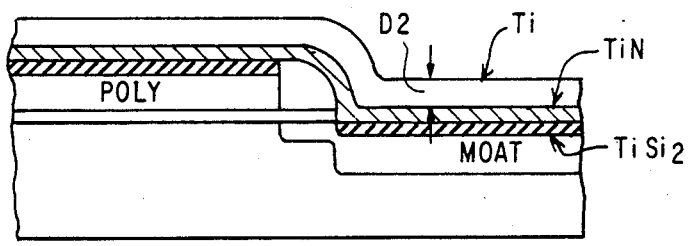
Figure 9D:
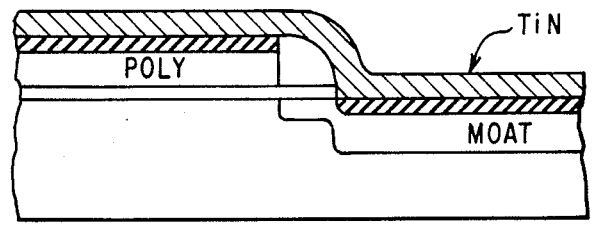
Figure 9E:
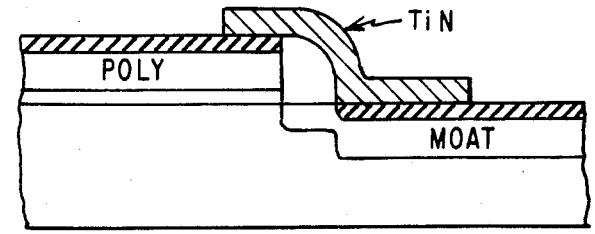

1. (FIG. 9A) Titanium is deposited to a first thickness d1, determined by the requirement of shallow source/drain junctions. The $TiSi_2$ thickness will be determined by d1 (roughly one to two times d1, depending on reaction conditions), and silicon will be consumed to a depth which is also determined by d1 (roughly one-half to two times d1, depending on reaction conditions).
2. The silicidation reaction is now performed in a nitrogen-bearing atmosphere (e.g. by furnace heating (e.g. 30 min at 675 C.) or by rapid thermal processing), to form TiN on oxide and a stacked $TiN/TiSi_2$ layer on moat, as shown in FIG. 9B.
3. (FIG. 9C) A second Ti deposition is performed to a thickness d2, where d2 is chosen to be in the range between 0.5 and 1 times the additional thickness of TiN desired.
4. The structure is again heated in a nitrogen-bearing ambient. Since the TiN layer on top of the $TiSi_2$ will prevent silicon atoms from outdiffusing to form $TiSi_2$, the second Ti layer will react with nitrogen and form TiN everywhere, as shown in FIG. 9D. The final thickness of TiN layer on oxide is determined by d1+d2.
5. The thicker TiN layer has now been formed, and is patterned and etched to provide local interconnects and/or etch stops and/or other structures as desired, as shown in FIG. 9E. Etching conditions are extensively described below.
6. A high temperature anneal can now be performed, at e.g. 800 C. (as discussed above), to lower the sheet resistance of the $TiSi_2$. Optionally, this step can be combined with the preceding step, so that the second titanium layer is reacting with the nitrogen ambient to form additional TiN at the same time as the silicides are being annealed.

Figure 2:
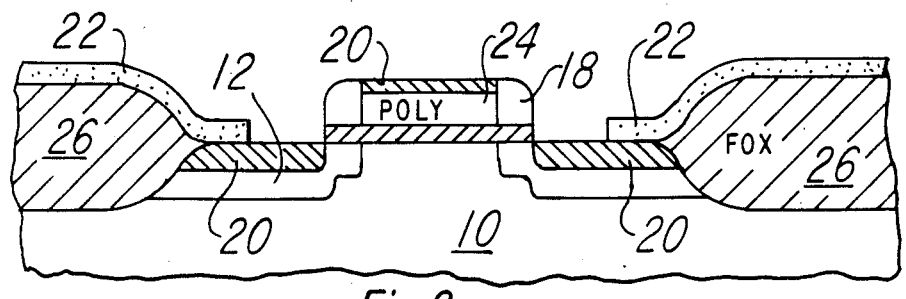
FIG. 2 shows a subsequent stage in the present invention, wherein the titanium nitride layer has been patterned to provide local interconnects and contact pads as desired.

After the silicidation step, the titanium nitride layer 22 is patterned, to produce the structure shown in FIG. 2. In one embodiment of the invention (not presently the most preferred embodiment) an oxide hardmask layer is deposited over the reacted TiN and patterned. That is, a thin oxide layer, for example 1000 A of TEOS oxide (oxide deposited from a gas flow containing tetraethylorthosilane (TEOS)) or of plasma oxide (deposited at e.g. 300 C. in a glow discharge) is patterned and then used as the mask in the following TiN etch. (Note that this embodiment differs from another embodiment discussed below where a hardmask is applied to the titanium metal before the heating step which forms TiN and $TiSi_2$, and subsequently left in place over the TiN to protect it from etching.)

This thin oxide layer is then patterned using an etchant gas composition such as $CF_4+5\% O_2$. A second etching step, e.g. a wet etch in $H_2O_2$ plus $NH_4OH$ is then used to pattern the TiN layer 22 in accordance with the pattern formed in the oxide hardmask, without etching away silicide layers 20 or sidewall oxide layers 18.

Alternatively, a hardened photoresist can also be used for better adhesion, so that the photoresist layer resists etching or lifting by the TiN wet etch solution, and no oxide hardmask is required. The success of this embodiment too has been experimentally confirmed.

Alternatively, patterned implants (e.g. of oxygen) could be used on the unreacted titanium (or on the reacted interconnect layer) to obtain differential resistance to stripping. (In this case, an additional anneal to obtain better chemical bonding of the implanted species may be required.) For example, it has been found that any inadvertent oxygen contamination makes the reacted titanium nitride layer very difficult to strip, so it is believed that a patterned oxygen implant should be very effective in obtaining selective etching of the reacted layer.

Alternatively, etches exhibiting selectivity of TiN over silicon oxide and titanium silicides can be used instead, without an oxide hardmask. Chlorine- and fluorine-based chemistries are generally the most suitable for such etches, and a class of fluorocarbon-based etch chemistries (and other fluoro-etch chemistries) is described in great detail below.

One presently practiced etching process for the TiN layer uses a dry/wet etch combination, where the dry etch is a $CF_4$ (200 sccm) + He (50 sccm) etch in a single-slice reactor with 0.3 inch electrode spacing, 200 W power, 1 Torr pressure and with the substrate heated to 50 C. The wet etch is done in a Megasonic bath with a diluted solution of $H_2O_2$ and $NH_4OH$. The duty cycle of the Megasonic agitation was reduced from the standard Megasonic strip process. In the current dry/wet process, about 80% of the TiN is etched by the dry etch and the remainder is removed by the wet etch. The selectivity of the dry etch of TiN to $TiSi_2$ is close to 2.5:1. Therefore, about 200 A to 300 A of $TiSi_2$ (as is the 400 A or so so of TiN formed on top of the $TiSi_2$ during the nitrogen atmosphere reaction step) is etched away during the dry etch, which results in a 15 to 20% degradation in silicide sheet resistance. The Megasonic strip process has been modified (with diluted solution and reduced duty cycle) to reduce its attack on the photoresist. Experimental results show that the resist did not lift after 15 min in the wet etch. A 9 minute wet etch is used in the dry/wet TiN etch process. As the selectivity of the dry etch improves, the wet etch role will reduce to a filament etch.

A sample set of conditions for TiN etching is as follows:
1. Dry etch:
   70 C. substrate
   Reactants: $CF_4$ (200 sccm) + He (50 sccm)
   silicon electrode reactor
   0.3 inch electrode spacing
   200 W power
   1 Torr pressure
2. Wet etch:
   Dilute solution of $H_2O_2$ and $NH_4OH$
   with ultrasonic agitation
   for 9 minutes These conditions will give a residence time for the $CF_4$ (volumetrically calculated, i.e. ignoring dissociation) of 1 second. The silicon electrode has been found found to be distinctly more advantageous than an anodized aluminum electrode when using such a $CF_4$-based TiN etch process, presumably to provide a fluorine-deficient plasma. The following is a general listing of the etch rate results for the two electrodes:

|   | Si Electrode | Anodized Al Electrode |
|---|---|---|
| TiN | 2250 A/min | 2600 A/min |
| $TiSi_2$ | 850 A/min | 1600 A/min |
| AZ-1400 (resist) | 5500 A/min | 8400 A/min |

The degradation in TiN:$TiSi_2$ and TiN:resist etch rate ratios observed with the anodized Al electrode points toward the importance of a fluorine-deficient plasma in achieving good selectivities between these materials. Some etch rates for this chemistry with other materials include: thermal oxide, 4750 A/min; AZ 1400, 5500 A/min; Kodak 820, 3300 A/min. The poor resist and oxide selectivities in these results prohibit doing dry etching only. However, increasing the slice substrate temperature from 50 to 70 degrees improves the resist selectivity by 25%.

That is, a "fluorine-deficient" plasma is one in which the ratio of fluorine atoms to other atoms (or at least to atom species derived from the source gas flow) is less in the plasma discharge volume that it is in the source gas flow. For example, in the $CF_4$ etch chemistry described, the ratio of fluorine atoms to carbon atoms in the source gas (where essentially all the carbon and all the fluorine is present as $CF_4$) is 4:1, but in the plasma (which includes $CF_4$ and also radical species such as free fluorine, $CF_2$, $CF_3$, etc.) the ratio is substantially smaller, e.g. 3.5 or less. (Note that the carbon atoms devolved from the substrate (e.g. volatiles outgassed from the photoresist) are not counted here.) Normally the etched surface itself will consume some fluorine to create a mild fluorine-deficiency; but one teaching of the present invention is that the fluorine-deficiency should be increased by increasing residence time and by using a fluorine sink in proximity to the glow discharge. The fluorine sink serves to preferentially remove fluorine from the plasma. For example, in the presently preferred embodiment, a silicon electrode serves as a fluorine sink, since it will be continually etched to form $SiF_4$. (Other materials having volatile fluorides, such as graphite, could also be used.)

Any fluorine discharge will etch TiN freely, but a simple fluorine discharge will also etch $TiSi_2$ rapidly; the problem is to etch TiN with some selectivity to $TiSi_2$.

It should also be noted that the use of fluorocarbons (as opposed to inorganic fluorine sources such as $SF_6$, $NF_3$, etc.) is itself particularly advantageous. When $CF_x$ radicals impinge on the TiN the carbon can go off as cyanogen radicals CM, which rapidly recombine to form volatile species such as $(CN)_2$, HCN, or FCN, but when the $CF_x$ radicals impinge on the silicide there is no such easy way to get rid of the carbon; the surface carbon from adsorbed species will therefore compete with the titanium atoms for reaction with impinging fluorine atoms, thus retarding the rate of formation of $TiF_4$ (and thus the rate of etching.) Thus, some fluorine centers (such as $BF_3$ or $SiF_4$) are unsuitable because they do not have a volatile nitride. Other fluorine sources (such as $SF_6$) are unsuitable because they are very copious fluorine sources; for example, $SF_6$ rapidly dissociates to form $SF_4$, and may then further dissociate to $SF_3$ radicals, etc. By contrast, $CF_4$ is a much milder (less copious) source of fluorine. To achieve fluorine deficiency, it is preferable to use a mild (not copious) fluorine source.

Moreover, the use of low gas flow rates increases the fluorine-deficiency of the plasma, but also increases the rate of polymer deposition. To keep polymer deposition from getting out of hand, the preferred embodiment uses elevated substrate temperatures (e.g. 70C.). At 70C. under the conditions given, an improved TiN:-$TiSi_2$ selectively can be achieved. The flow rate is preferably such as to replace the equivalent volume of the glow discharge 2 times per second or less. Higher substrate temperatures are also advantageous because they increase the volatility of the $TiF_4$ etch product, which tends to increase the etching throughput and also tends to give more selectivity to photoresist.

Thus, some of the important features of the TiN etching method taught by the present application include: a mild fluorine source, such as $CF_4$, is preferably used; a reducing electrode, such as silicon or graphite, is preferably used to scavenge fluorine; a relatively low flow rate is preferably used, to increase the fluorine deficiency of the plasma and thus increase the TiN:$TiSi_2$ etching selectivity; and the substrate temperature is preferably allowed to rise into the range between 60 and 100C. during etching.

It should also be noted that, if processing conditions are varied, the TiN layer may have a higher oxygen content and therefore may be difficult to remove with the wet etch given. In such embodiments it may be more preferable to use a dry etch chemistry of the type described as a blanket etch to strip the TiN layer, using higher pressure if needed to provide isotropy.

A sample process flow for patterning the local interconnects according to one embodiment of the present invention is as follows:

1. Pattern TiN local interconnects: use 1400-27 or 1400-31 resist.
2. Hardbake the resist to 120C.
3. Plasms etch the TiN:
   Gas: $CF_4$ (200 sccm)+He (50 sccm)
   Pressure: 1 Torr
   Time: 25 sec (90% of 1000 A TiN layer etched; i.e. the TiN etch rate is about 36 A/sec)
   Power: 200 W
   Substrate temperature: 50C.
4. Ti strip in Megasonic (i.e. an ultrasonically-driven wet etching bath)
   Solution: $NH_4OH$ (3000 cc)+$H_2O_2$ (1750 cc)+$H_2O$ (24000 cc)
   Time: 9 min
   Power: 250 W
   Duty cycle: 10% to 20% with 60 sec period
5. Ash the resist: 60 min
6. Solvent resist strip: R-10, 50C., 10 min
7. Cleanup
   Solution: HCl(37-38% concentration):$H_2O$ = 1:1
   Time: 20 min
8. $TiSi_2$/TiN anneal: 30 min, atmosphere including $N_2$ (e.g forming gas), at 800C.
9. deposit MLO, e.g. 5000 A of PSG
10. Pattern and etch contacts
11. Deglaze:
    Solution: 1% (volumetric) buffered HF; buffered HF solution is a mixture of HF:$NH_4F$:$H_2O$ = 49:11 by weight.
    Time: 60 sec.
12. Remaining conventional steps, e.g. deposit and pattern metal, vias and second metal (if used), protective overcoat, etc.

After the TiN layer 22 has been patterned as desired, to produce the structure of FIG. 22, a second annealing step is preferably used to lower the sheet resistance of the silicide layers 20 to one ohm per square or less. This second heat treatment step is preferably performed at 800 degrees C. for 30 minutes in an argon atmosphere at atmospheric pressure, but these parameters may be varied. For example, the annealing temperature could be in the range of 750 degrees to 875 degrees, or even wider, and the other processing parameters of this step can also be widely varied.

As noted, the titanium nitride layer 22 is not necessarily fully stoichiometric after the initial silicidation step. That is, this layer may contain excess titanium (or nitrogen). The presence of excess titanium is advantageous, in some embodiments since it facilitates the selective removal of the titanium nitride layer 22. If it is desired not to leave excess titanium in the interconnects in the finished integrated circuit (since titanium is highly reactive), a thinner layer of titanium can be deposited initially. Alternatively, by performing the subsequent annealing step in a nitrogen atmosphere, any excess of unreacted titanium may be removed.

In fact, the silicidation may optionally be performed as a transient heating step, using a flash lamp or laser heating or other transient heating methods. This tends to leave a higher atomic fraction of unreacted titanium in the titanium nitride layers, which as noted may facilitate patterning, and may be disposed of in the later anneal.

After the final anneal which lowers the sheet resistance of the silicide has been performed, processing then proceeds in conventional fashion. For example, an interlevel dielectric could now be deposited, such as 1000 A of low pressure CVD pad oxide followed by a micron of borophosphosilicate glass. Contact holes would then be cut in the interlevel dielectric and a patterned metal layer formed to achieve a desired pattern of electrical interconnections.

The only modification to subsequent processing which is preferably used is that the contact etch which cuts through the interlevel dielectric is preferably an etch chemistry which will stop on titanium nitride. This means that the titanium nitride layer 22 can be used as a diffusion barrier at the bottom of contacts, and also that the contacts to moat can be allowed to overlap onto the field oxide regions 26, since the titanium nitride 22 will prevent undercutting of exposed portions of field oxide 26 during the contact etch. Normal fluorine-based oxide etch chemistries, such as $CF_4$ plus 5% $O_2$, are reasonably selective to TiN.

Another alternative way to get a patterned local interconnect layer is to deposit and pattern a thin hardmask before the step of reacting the titanium in a nitrogen atmosphere. For example, a 1000 A layer of plasma oxide (i.e. silicon oxides deposited in a plasma reactor at low temperature, e.g. 300C.—this produces a fairly low density oxide) can be deposited over the titanium metal, etched to mask local interconnects in the desired pattern (using an oxide etch such as $CHF_3+C_2F_6+O_2+He$, which is selective to titanium, so that the titanium layer under the plasma oxide provides an etch stop) and left in place during the reaction which produces TiN and $TiSi_2$ compounds. There will be significant reaction between the titanium metal and the plasma oxide, so that (in one example where rapid thermal annealing was used) Rutherford Backscattering Analysis has revealed that the titanium metal under the plasma oxide layer has an oxygen to titanium atomic ratio of 0.69:1 (as compared to an oxygen to titanium atomic ratio, for titanium which lies on field oxide and is exposed to the nitrogen atmosphere during the reaction step, of around 0.25:1). This high oxygen content is not enough to destroy the metallic conduction properties of the titanium, but does impart substantial resistance to etching ($TiO_2$ is an extremely stable compound which is very difficult to etch). The metallic titanium remaining can be converted to titanium nitrides and/or silicides by a subsequent reaction step. It has been experimentally found that this process does provide a local interconnect with most or all of the valuable properties of the process described above, although the interconnect thus provided is not initially TiN, at least where rapid thermal annealing is used for the silicidation (its atomic fraction of nitrogen is much less than 1%, except possibly at the corners of the plasma oxide mask). Note that the plasma oxide mask remains in place through the TiN etching step. The material under the oxide mask after a furnace anneal is not exactly known, and may well be different; it may be a Ti/TiO$_2$ or Ti/-TiN/TiO$_2$ or TiN/TiO$_2$ or Ti/TiN/TiSi$_2$/TiO$_2$ composite. At any rate, it has been experimentally found that this process does provide a local interconnect with most or all of the valuable properties of the process described above. Note that the plasma oxide mask remains in place through the TiN etching step.

The additional fraction of oxygen introduced by this alternative embodiment can be highly advantageous in at least two ways. First, since TiO$_2$ is so chemically inert, it adds to the durability of the local interconnect layer as an etch stop at contact hole locations. Second, the etching of the TiN layer becomes simpler: a high fraction of oxygen in the layer under the hardmask makes it possible to wet etch the TiN without undercutting the hardmask patterned interconnects too much. A sample wet etch for this purpose would be NH$_4$OH+-H$_2$O$_2$ in water at room temperature, but many other wet etch chemistries could be used.

That is, titanium silicide typically gives a rough surface, so it is a pleasant surprise that the titanium under the oxide mask reacts with the oxide mask to form titanium oxides as a surface sealant. This surface TiO$_2$-rich layer avoids in-migration of etchants during a wet etch and thus permits the simple wet etch process described.

In an alternative version of this embodiment, the plasma oxide hardmask is stripped after the silicidation heating step (the 675 C. step in the example given) and before the annealing step (the 800 C. step in the example given). By ensuring that a nitrogen atmosphere is present during the high-temperature step, any possibility of silicon and dopant outdiffusion is suppressed, and the remaining metallic titanium which the oxide mask protected from the first heating step will substantially all be converted to nitrides, providing additional diffusion barrier advantages as described above. Another (less preferred) alternative way (for NMOS processes or some CMOS processes with two types of polysilicon) to convert the pattern titanium into a stable conductor is to perform the high-temperature anneal in an atmosphere which does not include nitrogen, so that silicon outdiffusion can convert the titanium metal in the local interconnect straps to titanium silicide.

Note that the oxide hardmask does not strictly have to be stripped at all—optionally it can be left in place through the whole remainder of the process.

A very important advantage of this embodiment is that no TiN etch is required—instead the TiN is simply dipped out using a standard clean-up solution. Thus this embodiment may be the most suitable of all for transfer into a manufacturing environment.

Another advantage of this embodiment is that it is very scallable, since the geometry-limiting step is simply an oxide etch.

Figure 3:
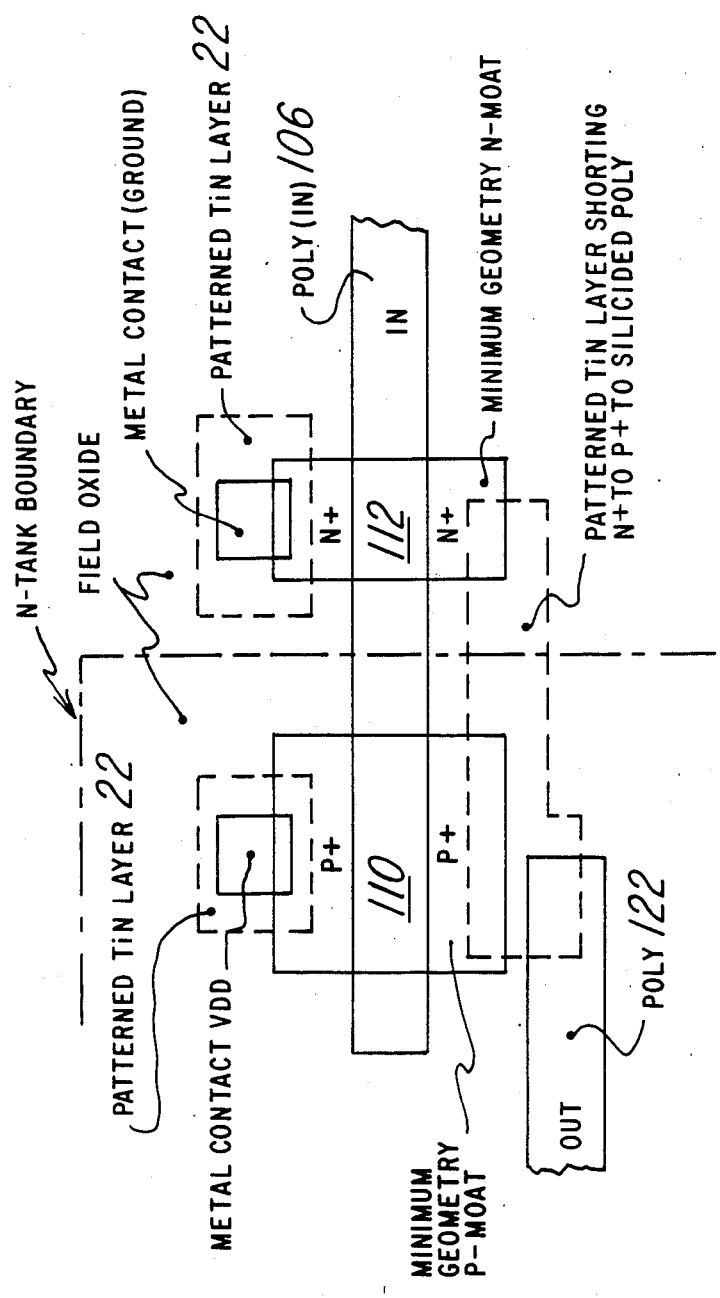
FIG. 3 shows a sample layout of a CMOS inverter using the novel device concepts of the present invention.

An example of the device applicability of the present invention is shown in FIG. 3. FIG. 3 shows a CMOS inverter, wherein an input signal is provided on a polysilicon line 106 which gates both a PMOS transistor 110 in a PMOS moat region 104 and an NMOS transistor 112 in an NMOS moat region 102. Metal contacts 120 are used to connect one source/drain of the PMOS transistor 110 to power supply and to connect one source/drain of the NMOS transistor 112 to ground. The output of the inverter is provided on a polysilicon line 122 which (in the portion shown) runs over field oxide. Note that the titanium nitride local interconnect layer 22 is used to connect the polysilicon output line 122 to NMOS moat 102 and to PMOS moat 104, eliminating the need for any buried contact. Note also that other patterned portions of titanium nitride layer 22 are emplaced under the metal contact locations 120, so that the titanium nitride there in place permits the metal contact 120 to overlap onto field oxide, and also provides a diffusion barrier at the bottom of the metal contact.

Figure 4:
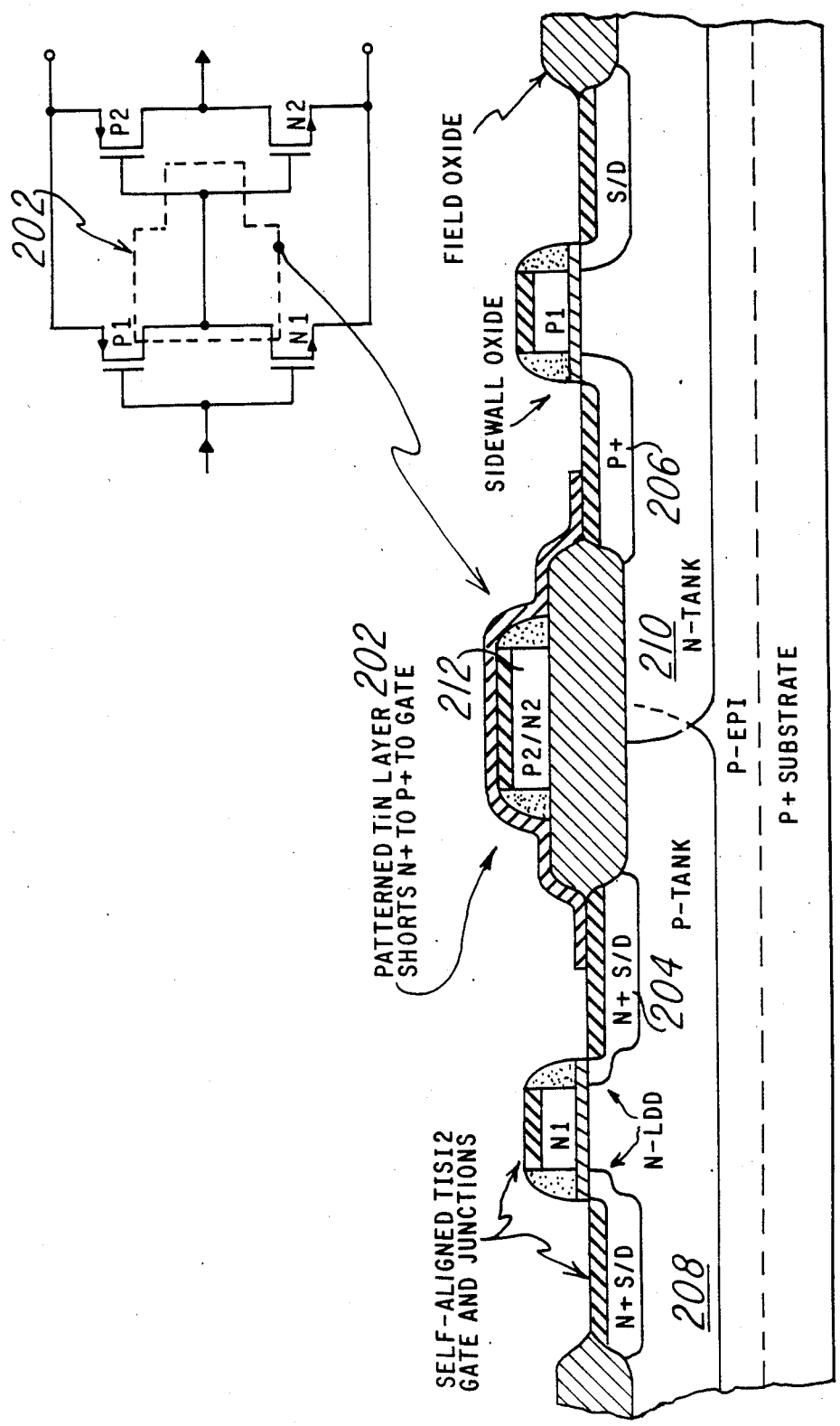
FIG. 4 shows a sectional view of a two-stage inverter, as a sample of the incorporation of the present invention in more complex CMOS logic structures.

FIG. 4 shows a sectional view of a two-stage inverter, as a sample of the incorporation of the present invention in more complex CMOS logic structures. Patterned local interconnect layer 202 connects N+ source/drain region 204 in P-tank 208 to P+ source/drain region 206 in N-tank 210, and also connects both of them to polycide line 212 which provides the input to transistors P2 and N2 in the next stage of logic. That is, the output of one stage (transistors P1 and N1) has been connected to the input of the next stage (transistors P2 and N2) WITHOUT ANY CONTACTS.

Thus, the present invention provides the advantage of local interconnect, which can connect moat to poly or moat to moat, including p+ moat to n+ moat, with a simplified processing sequence. Moreover, the present invention provides the further advantage that a diffusion barrier and etch stop can be located at the bottom of contact holes, so that metal contact processing is simplified, and dangers of overetch through field oxide 26 (which could create a short circuit to substrate 10) are reduced.

The conventional 6T SRAM cell comprises two inverters coupled back to back (in FIG. 5a the first inverter includes transistors P1 and N1, and the second inverter includes transistors P2 and N2), together with two pass transistors (transistors N3 and N4 in the example of FIG. 5a) to selectably connect the inverter outputs to a pair of bit lines BL and BL(bar). Note that in this conventional cell two metal jumpers (labeled MJ1 and MJ2 in this example) are used to connect the pull-up and pull-down transistors of each inverter together. This use of metal jumpers consumes large amounts of space.

By contrast, in the sample SRAM cell layout according to the present invention shown in FIG. 5b, wherein titanium nitride is used to make the interconnection, these metal jumpers are not needed. That is, the local interconnects L1 shown in FIG. 5b provide a capability for local interconnection of polysilicon to moat; from a circuit designer's point of view, they provide a capability very similar to that provided by first contacts (also known as buried contacts), and the use of titanium nitride interconnects has other advantages too.

In the prior art, buried contacts have been used in such layouts to eliminate the need for metal jumpers. Buried contacts are formed by patterning the gate oxide, before the polysilicon gate level is deposited, to form windows where the polysilicon will contact the moat. However, due to the dopant outdiffusion from the polysilicon, the traditional buried contact process to increase packing density becomes less attractive as MOS technology is scaled to the submicron regime. Furthermore, buried contact can only be used for N-channel devices if phosphorus doped polysilicon is used. Moreover, the fact that the gate oxide itself is being directly patterned is an inherent source of processing difficulties. These limitations make the traditional buried contact process incompatible with advanced VLSI CMOS processing, and a replacement is required.

Figure 6C:
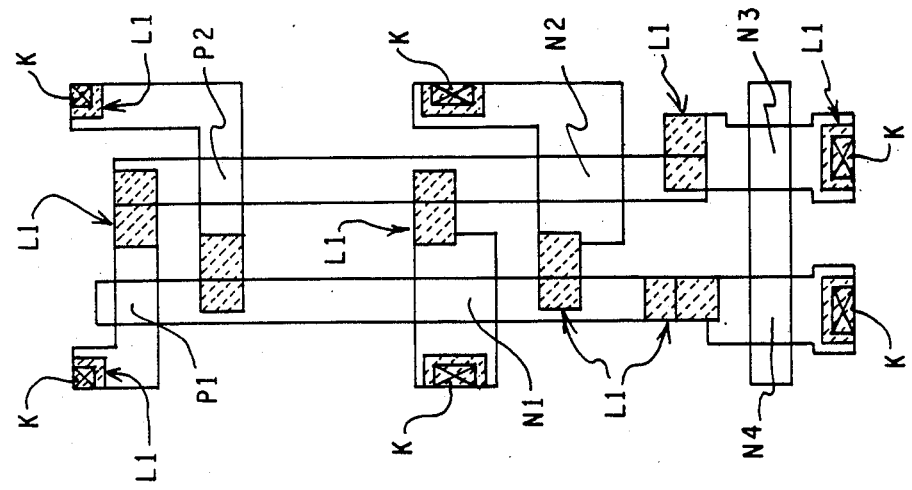
Figure 6D:
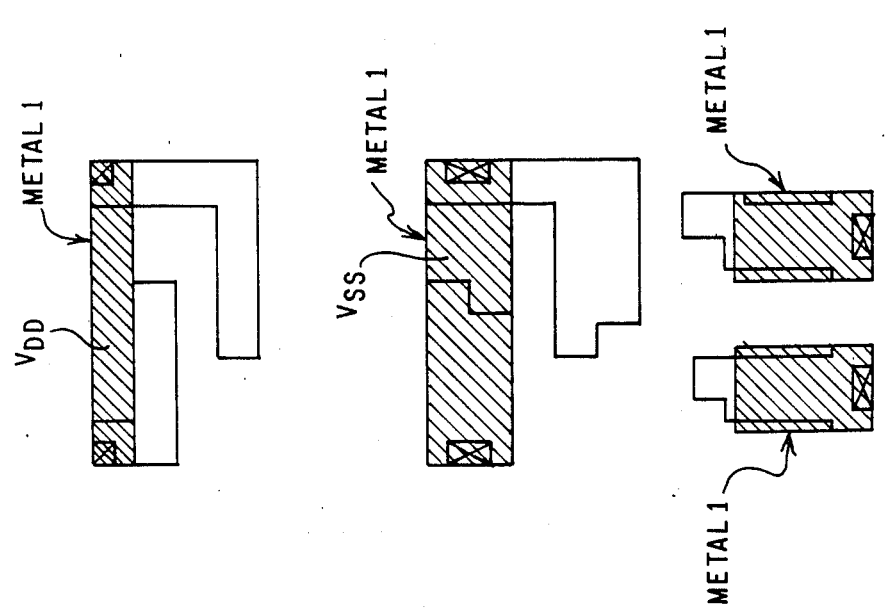
Figure 7:
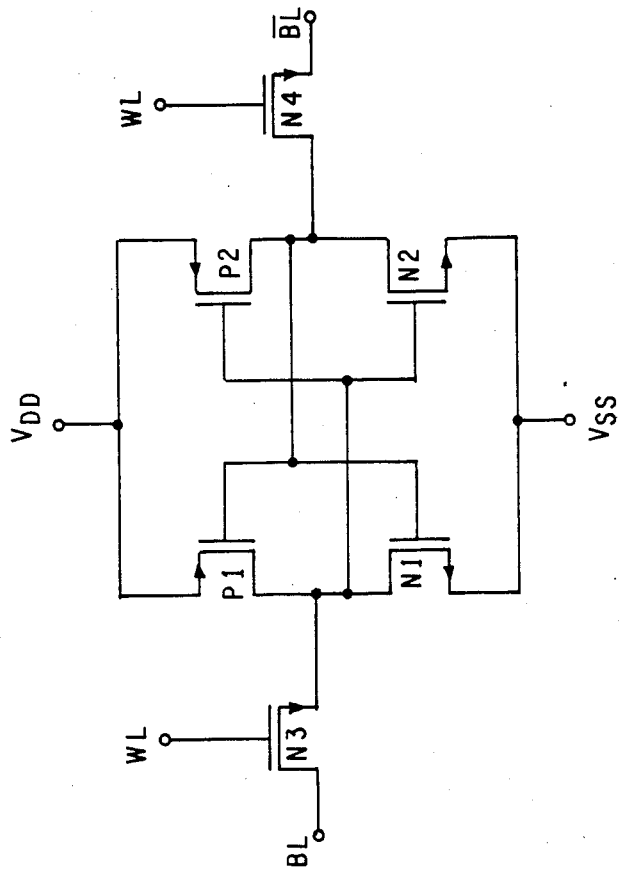
FIG. 7 shows the equivalent circuit diagram of the configuration of FIGS. 5a, 5b, and 6.

FIG. 7 shows the equivalent circuit diagram of the configuration of FIGS. 5a, 5b, and 6.

FIGS. 6a through 6e show a complete layout for an SRAM cell using titanium nitride local interconnect according to the present invention. Note that this layout is not quite the same as that shown in FIG. 5b. In FIG. 5b transistors N2 and N4 share a common moat, but, in the layout of FIG. 6, as may be seen in FIGS. 6b and 6c, transistors N2 and N4 are in separate moats from each other. Thus, within the single cell layout of FIG. 6c, portions of six different moats are seen. Although a single moat region may contain active devices from more than one cell, the two active pull-down devices in each cell are separated by field oxide (field isolation). This provides important speed advantages, as will be discussed below.

The layouts of FIGS. 5 and 6 include some features which are shared with the neighboring memory cells. That is, the cell of FIG. 6 would be bordered on its left and right sides by a left-right-reversed mirror image of itself, at its upper and lower edges by a top-bottom-reversed mirror image of itself, and diagonally by another image of itself which is both left-right and also top-bottom reversed. Thus, the actual scale of repeating geometries is in blocks of four SRAM cells. Moreover, the moat region including transistor P2, shown at the upper right of FIG. 6b and 6c, is only a portion of the actual patterned moat region. That is, the contact to the upper right of transistor P2 (which connects to the $V_{DD}$ supply) is shared among four adjacent SRAM cells, and each of those cells has its own transistor P2 close to that contact. Thus, the actual shape of the patterned moat, of which only a quarter is shown, is roughly the shape of a capital H lying on its side. Similarly, the contact to $V_{DD}$ shown at the upper left corner is also connected through a moat to four closely adjacent transistors P1 and four adjacent SRAM cells. The contacts to $V_{SS}$ near transistors N1 and N2 are also shared, but these contacts are only shared among two adjacent cells. Similarly, the contacts shown at the bottom of the layout in the orientation shown in FIG. 6c are also each shared among two adjacent SRAM cells.

Note that in FIG. 6c the local interconnect level LI is not only used to link the poly level to moat, but also is provided underneath the locations of each of the contacts K. The use of the patterned titanium nitride in these areas provides an etch stop which, as discussed above, helps prevent overetching and digging into the substrate when the contact holes are being etched.

FIG. 6a shows the moat and tank levels only, for a single cell. (The tank regions are n-type regions where PMOS devices may be formed; the moat regions define regions of the substrate which are not covered with field isolation). FIG. 6b shows the moat and poly levels (the poly level shows the location of polysilicon lines, which will create active device channel regions, by screening the moat regions from subsequent source-/drain implants, wherever they cross a moat). FIG. 6c shows the moat and poly levels of FIG. 6b, together with the local interconnect locations LI (where titanium nitride is left on the surface), and contact regions K (where a contact to substrate or to poly is opened by etching through a thick insulating layer (MLO) (which is typically a silicate glass which has been deposited overall and reflowed and possibly planarized, and which will insulate the first metal layer from the underlying polysilicon wiring and moat regions except where contact holes K have been opened)).

Note that the conventional layout of FIG. 5a includes some contacts to poly as well as some contacts to substrate. However, the layout of FIG. 6 does not include any contacts to poly. This is advantageous, for the following reason: Because the thickness of the MLO (silicate glass) overlying the polysilicon wiring will typically be much less than that overlying the substrate regions, the contact etch (which cuts contact holes through the MLO to both poly and to substrate simultaneously) must normally be very highly selective to polysilicon, if it is not to erode the polysilicon (or polycide, or whatever is used for the poly level) during the time after the polysilicon level contacts are opened until the contact holes for the substrate have been cleared. Since the SRAM cell according to the present invention does not require contacts to poly in the array, this processing constraint is minimized.

Figure 6E:
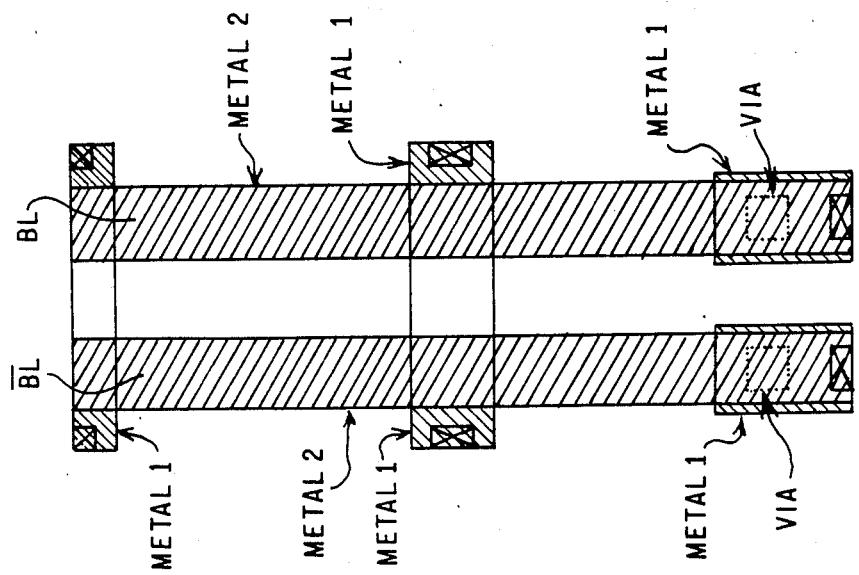

FIG. 6d shows the moat and contact patterns shown in FIG. 6c, together with the metal 1 pattern. The horizontal strip of metal 1 shown at the top of FIG. 6d is a $V_{DD}$ supply line, the middle horizontal strip is a $V_{SS}$ supply line, and the bottom two metal 1 portions will make contact (using the VIA pattern as shown in FIG. 6e) to the bitlines BL and BL(bar) in second metal, which are shown in FIG. 6e.

A sample flow to produce the local interconnects using the embodiments of FIGS. 5b and 6 would be as follows. After source/drains have been formed the titanium is deposited overall and is reacted in a nitrogen atmosphere, to form titanium silicides over moat regions and titanium nitride elsewhere. Photoresist is then patterned to protect the areas where it is desired to keep the local interconnects LI, as shown e.g. in FIG. 6c, and plasma etching is then performed. A sample set of etch conditions is 200 sccm of carbon tetrafluoride ($CF_4$) plus 50 sccm of helium at a total pressure of 1 Torr for 25 seconds. An initial titanium nitride layer of 1000 A will be 90% etched away under these conditions, i.e. the resultant TiN etch rate is about 36 Angstroms per second. In this sample embodiment, this step is performed in a single plate plasma reactor with a power of 200 Watts at a substrate temperature of 50 degrees C.

Next, a wet etch is used to strip the remainder of the undesired titanium nitride, to avoid shorts to the filaments. A solution of ammonium hydroxide (3000 cc) plus hydrogen peroxide (1750 cc) plus water (24 liters) is ultrasonically agitated for 9 minutes, using a duty cycle of 10 to 20 percent per 60 seconds, at an ultrasonic power of 250 Watts.

Next, a conventional ashing step is used, e.g. 60 minutes in an asher, followed by a solvent resistant stripping operation, e.g. 10 minutes in R-10 (a commonly used organic resist stripping solution, consisting of about 70% diethyleneglycolmonobutylether in ethanol) at 50 degrees C., followed by a cleanup in dilute HCl (37% HCl solution diluted 1 to 1 with water) for 20 minutes. Next, an anneal to enhance the silicide quality is performed, e.g. 30 minutes at 800 degrees C. Next, the MLO layer is deposited conventionally, and the contacts are patterned and etched.

However, after the contacts are etched, the deglazing step (which removes unwanted oxides from the bottom of the contact hole, which can degrade contact resistance or even destroy the contact) is performed using buffered HF. It has been found that buffered 1% HF, at least if buffered with ammonium fluoride, will not attack the titanium nitride local interconnect layers. A sample of the solutions with which this has been performed is 1% $HF:NH_4F:H_2O$ in the ratio of 49 to 40 to 11 by weight.

The processing then proceeds conventionally, with first metal deposition and patterning, interlevel oxide deposition, via patterning, second metal deposition and patterning, and protective overcoat patterning, in a normal sequence.

It should be noted that, instead of performing the titanium nitride etch as described above, before the high temperature anneal which gives the clad moats good low sheet resistance, it is alternatively possible to ramp directly up the 800 degrees C. anneal immediately after the initial silicidation reaction. It has been found that, surprisingly, using this process sequence, the titanium nitride can still be stripped efficiently from areas where it is unwanted. It should also be noted that the cleanup conditions prior to the furnace reaction are quite important; the use of dilute HCl as noted above works well, but with some other plausible cleanups titanium nitride filaments may be found to run along the gate edges, and create shorts from moat to moat.

Another advantage of using the local interconnect layer in the contact holes is that, as is well known, titanium nitride is quite a good diffusion barrier. Thus, using the titanium local interconnect layer at these locations provides better device yield and reliability, by reducing diffusion effects between aluminum and silicon.

It should be noted that, not only does the area of the cell of the present invention provide an area advantage of about 20% over the prior art cell of identical geometries, but moreover the area of the sample cells in FIGS. 5b and 6 is limited by the pitch of the second layer metal. Thus, if the second metal pitch can be decreased, this cell could be further shrunk, which would have the potential to further increase the area advantage of this cell over the conventional cell.

A major advantage of the present invention is reduced moat capacitance. Since the contact pattern is not required for strapping moat to poly, the moat area can be kept strictly to its minimum value, and therefore the moat junction parasitic capacitance is reduced. This reduced parasitic loading capacitance directly results in an improved switching speed for the cell. The present invention is believed to provide approximately a 35% reduction of moat junction capacitance over conventional SRAM cell layouts, with the corresponding improvement in switching speed.

A further advantage of the titanium nitride in contact holes is that many a good contact etch, such as $C_2F_6+CHF_3+O_2+He$, is more selective to titanium nitride than it is to titanium silicide. Thus, degrading resistance of the contacts by increasing the sheet resistance of the clad moat underneath the contact is a reduced risk.

Thus, it is believed that the present invention is the first to provide a 6 transistor SRAM cell having compact geometries in which no two devices within any one cell share a common continuous moat region. This is related to the advantages of reduced junction parasitic capacitance discussed above.

Of course, SRAM cells of various kinds can embody the novel concepts taught by the present invention: full-CMOS 6T cells (NMOS pull-down and pass (access) transistors, and PMOS pull-up transistors), "upside-down" full-CMOS 6T cells (i.e. with PMOS pass transistors), NMOS or pseudo-NMOS cells (using a linear or nonlinear resistance, or even an SOI transistor, as a load element, etc.

Another very important and novel class of embodiments taught in the present application, which were not specifically disclosed in the parent application, provides small-geometry CMOS integrated circuits having two conductivity types of polysilicon (or analogous material) for the gate level, with the two conductivity types being electrically connected by a local interconnect, substantially comprising titanium nitride, as taught in the parent application.

Figure 8:
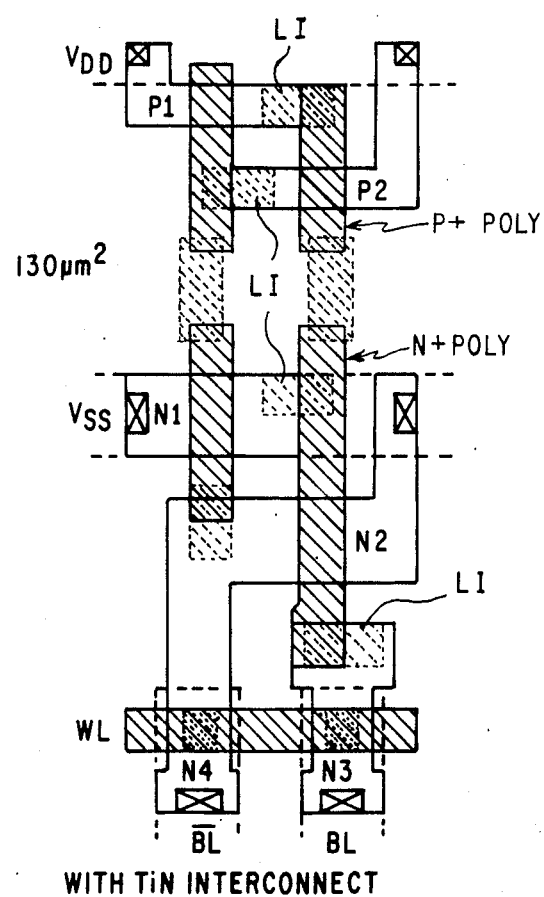
FIG. 8 shows a sample configuration of submicron CMOS circuitry, wherein PMOS transistors have p-type polysilicon gates and NMOS transistors have n-type polysilicon gates, and electrical connection between the p-type and n-type gates is provided by a titanium nitride local interconnect running across the tank boundary (In the example shown, this is used to configure an SRAM cell)

FIG. 8 shows an example of this embodiment. The SRAM cell shown as a sample layout is very similar to the SRAM cell of FIG. 5b, except that the polysilicon is not continuous from the p-channel transistors to the n-channel transistors: the gates of transistors P1 and P2 are p+ polysilicon, and the gates of transistors N1, N2, N3, and N4 are n+ polysilicon. The polysilicon over the PMOS areas is exposed to the p+ source/drain implants, and the polysilicon over the NMOS areas is exposed to the n+ source/drain implants. If the source/drains are counterdoped, the polysilicon will be also. The polysilicon may be originally deposited undoped, or it may be subjected to a slight blanket doping (either p- or n-type) to balance the conductivities of p+ and n+ poly lines as desired. It may be desirable (though not necessary) in this embodiment to use thinner polysilicon and/or higher dose source/drain implants than would otherwise be the case, since (for example) the dose which will dope a 1500 A deep source/drain to an average concentration of $1E18$ $cm^{-3}$ will only dope a 5000 A layer of polysilicon to about $3E17$ $cm^{-3}$ (or less, depending on how much of the dopant species is gettered by the grain boundaries and fails to ionize).

Another very advantageous use of the local interconnect structure is, in a double-poly process, to provide a triple interconnect for first and second polysilicon layers. That is, a single direct-react silicidation process can be used to silicide moat, poly 1 (partially), and poly 2 at the same time, and the TiN local interconnect level formed during this silicidation step can be patterned to connect first poly, second poly, and moat, in any desired combination, all in one single interconnect level.

This local interconnect improvement can readily be inserted into the double-poly processes commonly used in analog parts, where the poly 2 layer is used as the primary gate layer, and the poly 1 layer is used for poly-to-poly capacitors, and/or (sometimes) resistors. At present such processes normally do not permit direct connection of poly 1 to poly 2, but metal jumpers must be used instead. It would be highly advantageous to be able to do direct local interconnect between poly 1 and poly 2 and moat, and the present embodiment of the TiN process flow permits this.

In analog processes the poly-to-poly dielectric is thin, and the coupling capacitance is very high, but this interconnect improvement can also be used with much thicker poly-to-poly dielectrics, so that crosstalk between poly 1 and poly 2 is not large. For example, a poly-to-poly dielectric of 1000 A is thick enough for many applications, and this thickness of oxide can be cleared during the sidewall oxide filament overetch.

This not only facilitates layout in analog parts, and similar places where a double-poly process is already in use; it also provides designers with a full independent layer of interconnect, with minimal additional processing overhead and without intruding into the metal layer. This is highly advantageous for logic layout generally. It is particularly advantageous in custom and semi-custom layouts, where segmentation of the design process makes it desirable to leave the metal layers free as much as possible. It is also useful in memory array layout.

This improvement is applicable to most processes where the poly 2 level is used as a silicided gate layer, regardless of whether the poly 1 layer is used for gates, or for capacitors to moat, or for poly-to-poly capacitors, or simply for a fully independent interconnect layer. It may also be possible to use this process with a refractory metal interconnect layer in place of the poly 1 layer (although encapsulation of this layer then becomes more difficult).

For example, in advanced SRAM cell layouts the second metal pitch can become a constraint on compaction. Use of a poly 1 layer as a buried interconnect means that the bitlines can be shared, because doubled wordlines can be used so that each wordline accesses only alternate cells. The problem of routing the duplicate wordline through the cells where it is not needed is solved by using the additional routing capability of the poly 1 level to route this line through the wasted space over the tank boundary.

This capability is also useful in scaled CMOS, where the poly 1 layer may be doped p+ and used for PMOS gates, and the poly 2 layer doped n+ and used for NMOS gates. The diffusion barrier characteristics of the TiN mean that short lengths of p+ and n+ poly can be pieced together using TiN straps to form electrically efficient routings, without worrying about counterdiffusion. The advantages of using TiN to link P+ and n+ polycide gates for submicron CMOS were pointed out above; the additional suggestion in this embodiment is merely that the p+ and n+ polycide gate portions can be provided by two different levels poly 1 and poly 2, instead of by implanting a single poly layer.

This capability may also be very useful in high-voltage CMOS circuits, where one level of poly is used for gates for high-voltage transistors and another level is used for gates of normal logic. For example, the triple interconnect process described here permits poly 1 gates of low-voltage transistors to be connected locally to moats of low-voltage or high-voltage transistors, and poly 2 gates of high-voltage transistors to be connected locally to moats of low-voltage or high-voltage transistors, and also permits interconnection of low-voltage transistors' source/drain regions to source/drain regions of high-voltage transistors, and also permits poly 1 gates to be connected directly to poly 2 gates. The high-voltage transistors will be formed to have higher punchthrough voltage from source to drain, and/or higher breakdown voltage across the source/drain junction, and/or higher gate-to-source breakdown voltage, than the low-voltage transistors. To achieve this, for example, poly 2 may be patterned so that the high-voltage transistors have longer effective channel length, and an additional $V_T$ or LDD implant may be performed after poly 1 has been patterned. In a further alternative embodiment, if sidewall oxides are formed both on poly 1 and poly 2 levels, the layout and oxide filament deposition may be adjusted so that the poly 1 gates have two sidewall oxide filaments, and therefore the high-voltage transistors (in poly 1, in this embodiment) have LDD regions which have a greater spacing between the gate edge and highly doped source/drain regions than the low-voltage transistors do. Moreover, the gate oxides can easily be made thicker for the high-voltage devices, since the gate oxides for the two levels are grown in separate steps. Alternatively, a masked tank implant may be used, so that the high-voltage transistors (at least the NMOS ones) will have a different substrate concentration in the channel than the low-voltage transistors will. For example, counterdoping may be used with tank implants or with source/drain implants, so that one type of NMOS transistors have counterdoped source/drains or tanks (i.e. are exposed to the corresponding implants for the PMOS devices as well), and the other type of NMOS transistors are masked from the PMOS (counterdoping) implants. Such circuits may include EPROMs, high-voltage drivers (to control analog, high-voltage, and/or power devices off-chip), and/or control logic.

A sample process flow for this embodiment is as follows:
1. Form moats and field isolation regions.
2. Grow gate oxide, and deposit, dope and pattern poly 1
3. Strip moats and grow a new gate oxide, e.g. 200 A. This step will also grow a thicker oxide on the poly 1 layer, e.g. 750 A.
4. Deposit poly 2, e.g. 4000 A thick $POCl_3$-doped.
5. Pattern and etch poly 2.
6. Perform LDD implants if desired.
7. Sidewall oxides: Deposit conformal oxide and overetch to leave sidewall oxide filaments and also clear oxide from on top of exposed portions of poly 1. (Overetches to clear up to 1000 A of oxide during the filament overetch are well known.)
8. Perform source/drain implants (self-aligned to poly 1 and poly 2 gates), masked if for CMOS.
9. Deposit titanium overall, and heat it for 30 minutes in $N_2$ at 675 C. to form $TiSi_2$ on exposed moats and polysilicon lines, and TiN elsewhere. Poly 2 will now be silicide clad everywhere; poly 1 will be silicided everywhere except where it is crossed by poly 2; and moat will be silicided everywhere except at poly 1 and poly 2 locations.
10. Pattern TiN to form local interconnects between moat, poly 1, and poly 2 in whatever pattern is desired.
11. Anneal at 800 C. to activate S/D implants and lower silicide sheet resistance.
12. Processing continues conventionally with MLO, contact patterning, metal, etc.

In an alternative embodiment, using a nitride dielectric for poly-to-poly capacitors, a sample process flow is as follows:
1. Form moats and field isolation regions.
2. Deposit and dope first poly.
3. Form a protective dielectric over first poly by, e.g., growing and stripping sacrificial oxide, growing 100 A oxide, and depositing 100 A of LPCVD nitride. The nitride will provide protection against uncontrolled oxide growth over poly 1 during the second gate oxide growth step.
4. Pattern and etch oxide/nitride/polysilicon stack.
5. Strip exposed moat portions (short oxide etch so as not to remove protective dielectric from first poly)
6. Grow a new gate oxide, e.g. 200 A. (This will also convert 50 A or so of nitride to oxide on the surface of the protective dielectric over poly 1, and will also help oxidize and passivate any pinholes in the poly 1 encapsulation.)
7. Deposit second polysilicon, e.g. 4000 A thick $POCl_3$-doped. Less preferably, this level may be made substantially thicker than normal, to provide more margin in the filament overetch.

8. Pattern and etch poly 2.
9. Perform LDD implant if desired.
10. Sidewall oxides: Deposit conformal oxide and overetch. The filament overetch will also clear the thin oxide/nitride/oxide stack from the first polysilicon layer. This step will provide sidewall oxides on both poly 2 and poly 1.
11. Perform source/drain implants, masked if for CMOS.
12. Deposit titanium overall, e.g. 1000 A sputtered at room temperature, and heat it 30 minutes in $N_2$ at 675 C. to form $TiSi_2$ on exposed moats and polysilicon lines, and TiN elsewhere.
13. Pattern TiN to form local interconnects between moat, poly 1, and poly 2, in whatever pattern is desired.
14. Anneal at 800 C. to activate S/D implants and lower silicide sheet resistance.
15. Processing continues conventionally with interlevel dielectric, contact etch, metal, etc.

One possible constraint on this process is topography: it may be appropriate to have a design role requiring a minimum offset between poly 1 edges and poly 2 edges.

Optionally, the second polysilicon layer may be deposited to be substantially thicker than normal, e.g. up to 10,000 A, to provide more margin in the filament overetch and avoid oxide filaments where poly 2 crosses poly 1—such filaments can cause a break in the silicide layer which overlies the poly 2 level, and thus increase the series resistance of poly 2. If the poly 2 layer is to be made extremely thick, the gran size can be kept less than the minimum linewidth (in one alternative embodiment) by depositing the poly 2 as a layered structure; for example, a very thin layer of a leaky dielectric (thin enough that conduction can easily occur by tunneling, e.g. 30 A of nitride oxide) may be included in the middle of the thick polysilicon layer by changing the gas flow briefly during deposition. Low temperature deposition (e.g. as low as 560 C.) may also be useful to keep grain size small. In this embodiment, it may also be desirable to use a polysilicon etch which has an extremely high selectivity to oxide, so that the overetch portion of the polysilicon etch does not cut through the gate oxide where poly crosses moat; for example, etches using bromine-based chemistries (such as HCl plus HBr) readily provide selectivities of 30:1 or better in production environments. Another optional feature of this class of embodiments is to impose a design rule which forbids making contact from metal directly to poly 2. (In the present invention, such a design rule is much less onerous than it would otherwise be, since a short local interconnect run can be used to link poly 2 to a contact pad on field oxide or on a plug of poly 1. Usually it will be preferable to forbid contact from metal to poly 2 where it crosses over poly 1, even if poly 2 is not made unusually thick.

In future alternative embodiments, the filament etch can be done using a chemistry which is slightly selective to oxide, e.g. $NF_3$ (which in an 8110 gives about a 2:1 nitride/oxide ratio) or $SiF_4$ (which will etch nitride about 4:1 over oxide). With a 2:1 nitride/oxide ratio, and a 1000 A overetch during the sidewall oxide filament etch, as much as 2000 A of nitride could be cleared from exposed flat surfaces of poly 1.

It should also be noted that the present invention permits not only local contacts to moat, but also to buried diffusions, i.e. diffusions which are covered by thick enough oxide (e.g. 1000 A) that an active device does not necessarily occur at every point where polysilicon crosses it. For example, the filament overetch of the poly gate level can be operated with enough overetch to clear the buried diffusion in all exposed regions, so that silicidation will occur and TiN straps can link buried diffusions to poly 1, poly 2, etc.

This embodiment of the invention may also be advantageous as a way to configure SRAM cells where a resistor is used to separate the PMOS latch from the NMOS latch, to minimize the chance of upset by transient events. For such structures, first poly can be used to configure compact resistors over the tank boundary, and the TiN local interconnect can be used to make local connection to these resistors without requiring contacts to metal.

This embodiment of the invention also provides one way (albeit somewhat inelegant) to solve a problem which has been pervasive in double-poly processes: formation of the sidewall oxide filaments on the poly 2 level also tends to leave oxide filaments where poly 2 crosses over poly 1, and these unwanted filaments will cause breaks in the siliciding of poly 2. These breaks in a regular pattern can cause excessive series resistance. In many processes, these filaments can be avoided by putting sidewall oxides on poly 1, but, if need be, these breaks can be bridged using the present invention, by strapping them with TiN jumpers.

Moreover, while the present application has referred primarily to titanium-based thin film compositions, other metals could be substituted in. For example, any metal which (1) reacts with silicon to form a conductive and stable silicide, and (2) whose nitride is (2a) conductive and (2b) stable and (2c) a reasonable diffusion barrier, can be used for direct-react silicidation and simultaneous formation of a conductive nitride which can be used to form local interconnects according to the present invention; candidates include molybdenum, tungsten, vanadium, cobalt, and others.

Of course the poly gate layer (or poly 1 and poly 2 gate layers) so frequently referred to in the present application does not have to be strictly polysilicon, but can be other materials which are substantially polycrystalline or amorphous and contain a large fraction of silicon; in this usage silicides and polysilicon/silicide sandwich structures are certainly comprehended, and future sandwich structures which have analogous deposition and electrical properties in future processes to the place of polysilicon in present processes are intended to be comprehended also.

It should also be noted that the present invention is applicable to a tremendous variety of processes which are quite different in many respects from that described; for example, the present invention is perfectly well applicable to SOI processes, or to processes using trench transistors, as well as to the more conventional bulk-CMOS processes primarily described.

As will be appreciated by those skilled in the art, the present invention can be widely modified and varied, and its scope is not limited except as specified in the allowed claims.

What is claimed is:

1. A process for fabricating integrated circuits, comprising the steps of:
   (a) providing a partially fabricated integrated circuit structure;
   (b) providing a thin film which consists substantially of titanium nitride and which extends over a significant area of said partially fabricated integrated circuit structure;

(c) providing a patterned masking material over said titanium nitride thin film; and (d) etching said titanium nitride thin film in a glow discharge formed from an input gas flow comprising a fluorine-liberating gas.

2. The process of claim 1, wherein said step (b) of providing a thin film comprises the substeps of:

depositing a metal consisting predominantly of titanium;

heating said partially fabricated integrated circuit structure in an atmosphere comprising nitrogen, whereby at least portions of said metal react to form a composition predominantly comprising titanium nitride.

3. The process of claim 1, wherein said glow discharge is fluorine-deficient.

4. The process of claim 1, wherein said fluorine-liberating gas comprises a mild fluorine source and does not include any copious fluorine source.

5. The process of claim 1, wherein said fluorine-liberating gas consists predominantly of fluorocarbons.

6. The process of claim 1, wherein said fluorine-liberating gas consists predominantly of $CF_4$.

7. The process of claim 1, wherein said input gases to said glow discharge comprise helium.

8. The process of claim 1, wherein said glow discharge is created in proximity to a fluorine sink.

9. The process of claim 1, wherein said glow discharge is created in proximity to an electrode comprising a reducing material.

10. The process of claim 9, wherein said reducing electrode consists essentially of monocrystalline silicon.

11. The process of claim 1, wherein said partially fabricated integrated circuit structure is held at a temperature in the range of 60 C. to 100 C. during said etching step (d).

12. The process of claim 1, wherein said fluorine-liberating gas is flowed at a rate slow enough to provide an average residence time (volumetrically calculated, i.e. ignoring dissociation) for molecules of said fluorine-liberating gas in said glow discharge of at least 500 milliseconds.

13. The process of claim 12, wherein said partially fabricated integrated circuit structure is held at a temperature of 60 C. or more during said etching step (d).

14. The process of claim 1, wherein said patterned masking material consists essentially of photoresist.

15. The process of claim 1, further comprising the subsequent steps of:

(e) removing said masking material;

(f) depositing an interlevel dielectric overall;

(g) forming contact holes at predetermined locations in said interlevel dielectric, to expose portions of said titanium nitride thin film at the bottoms of at least some of said contact holes;

(h) deglazing exposed portions of the bottoms of said contact holes in a buffered HF solution; and (i) depositing metal overall.

16. The process of claim 1, further comprising the subsequent step of:

(e) wet etching said partially fabricated integrated circuit structure to remove remaining exposed portions thereof.

17. The process of claim 16, wherein said wet etching step (e) is performed in a basic solution containing hydrogen peroxide.

* * * * *